US009171917B2

(12) United States Patent
Bobde et al.

(10) Patent No.: US 9,171,917 B2
(45) Date of Patent: Oct. 27, 2015

(54) EDGE TERMINATION CONFIGURATIONS FOR HIGH VOLTAGE SEMICONDUCTOR POWER DEVICES

(71) Applicant: Alpha and Omega Semiconductor Incorporated, Sunnyvale, CA (US)

(72) Inventors: Madhur Bobde, San Jose, CA (US); Sik Lui, Sunnyvale, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/162,220

(22) Filed: Jan. 23, 2014

(65) Prior Publication Data

US 2015/0206943 A1 Jul. 23, 2015

Related U.S. Application Data

(62) Division of application No. 13/134,163, filed on May 31, 2011, now Pat. No. 8,643,135.

(51) Int. Cl.
*H01L 29/78* (2006.01)
*H01L 29/40* (2006.01)
*H01L 29/06* (2006.01)

(52) U.S. Cl.
CPC .......... *H01L 29/407* (2013.01); *H01L 29/0615* (2013.01)

(58) Field of Classification Search
CPC .................................................... H01L 29/7823
See application file for complete search history.

(56) References Cited

U.S. PATENT DOCUMENTS

| 2009/0309156 A1* | 12/2009 | Darwish et al. ............... 257/332 |
| 2010/0219468 A1* | 9/2010 | Zeng et al. ..................... 257/330 |
| 2011/0089488 A1* | 4/2011 | Yilmaz et al. ................. 257/331 |
| 2012/0306044 A1* | 12/2012 | Bobde et al. .................. 257/488 |

* cited by examiner

*Primary Examiner* — Lex Malsawma
(74) *Attorney, Agent, or Firm* — Bo-In Lin

(57) ABSTRACT

This invention discloses a semiconductor power device disposed in a semiconductor substrate and having an active cell area and an edge termination area wherein the edge termination area comprises a wide trench filled with a field-crowding reduction filler and a buried field plate buried under a top surface of the semiconductor substrate and laterally extended over a top portion of the field crowding field to move a peak electric field laterally away from the active cell area. In a specific embodiment, the field-crowding reduction filler comprises a silicon oxide filled in the wide trench.

8 Claims, 10 Drawing Sheets

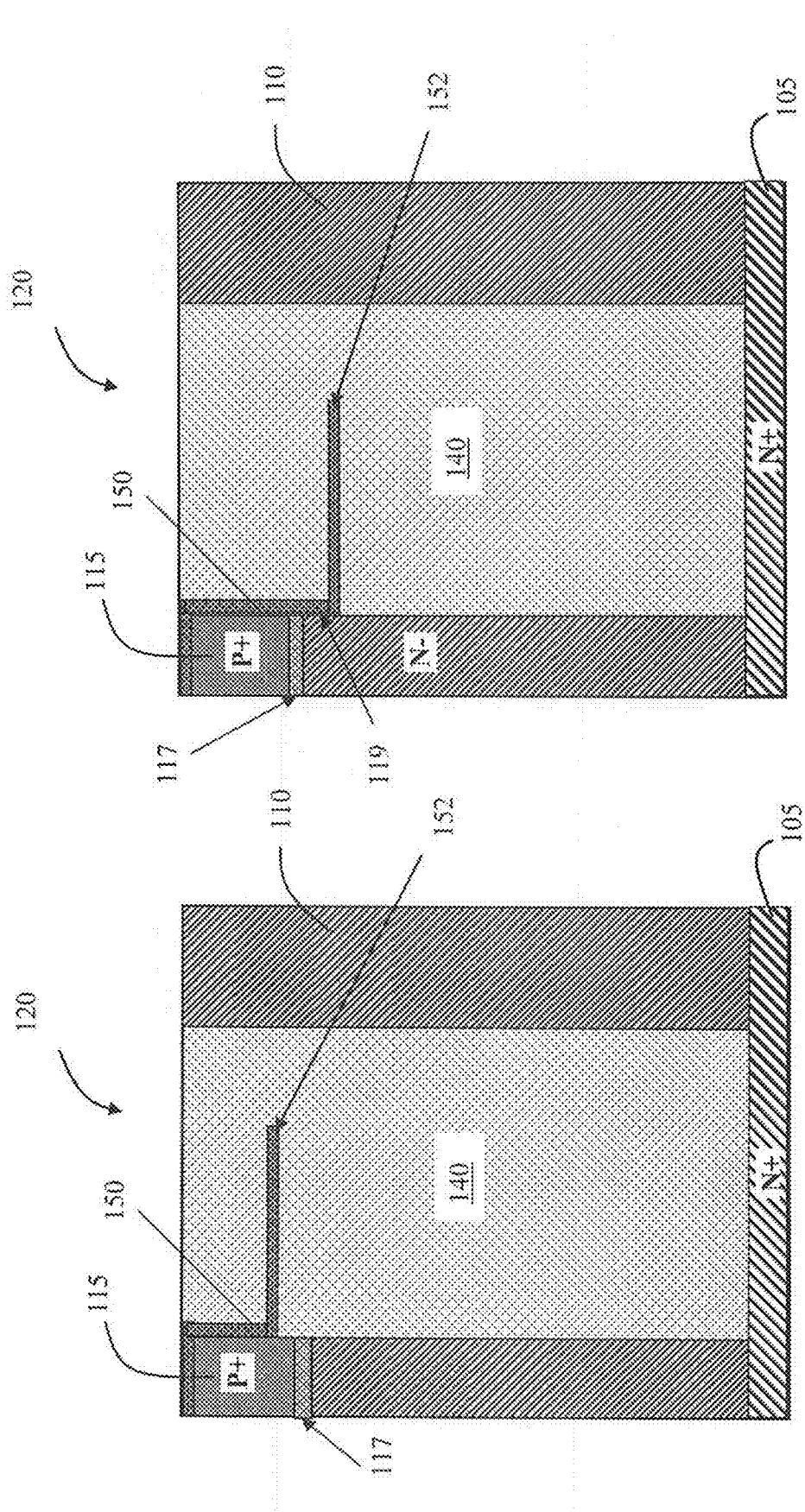

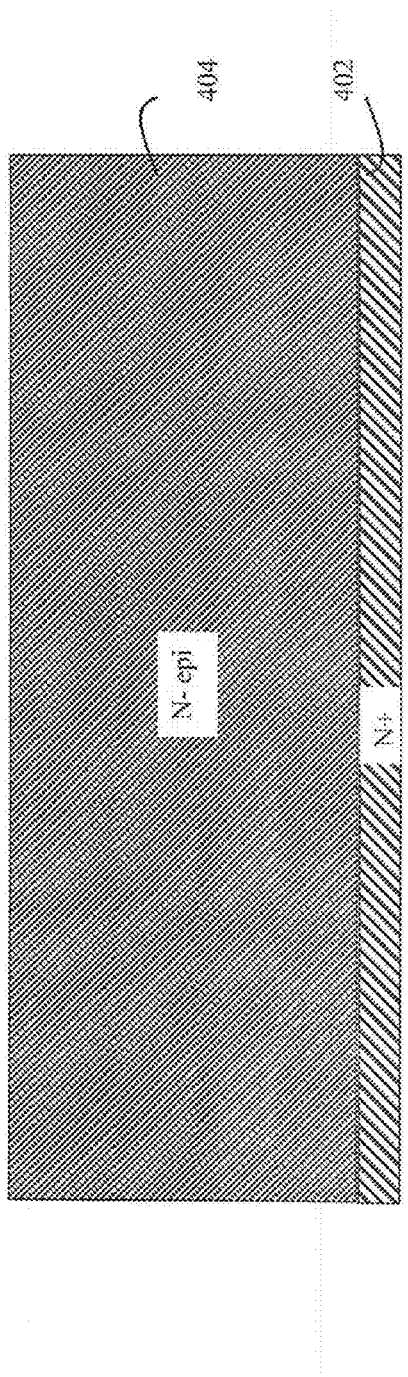
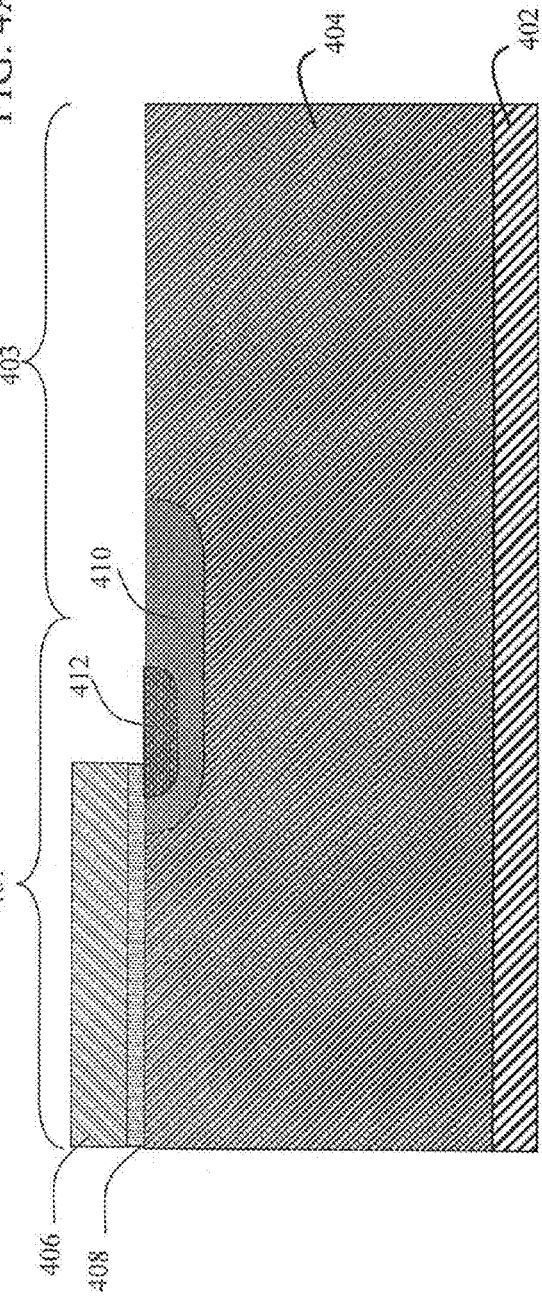
FIG. 4A
FIG. 4B

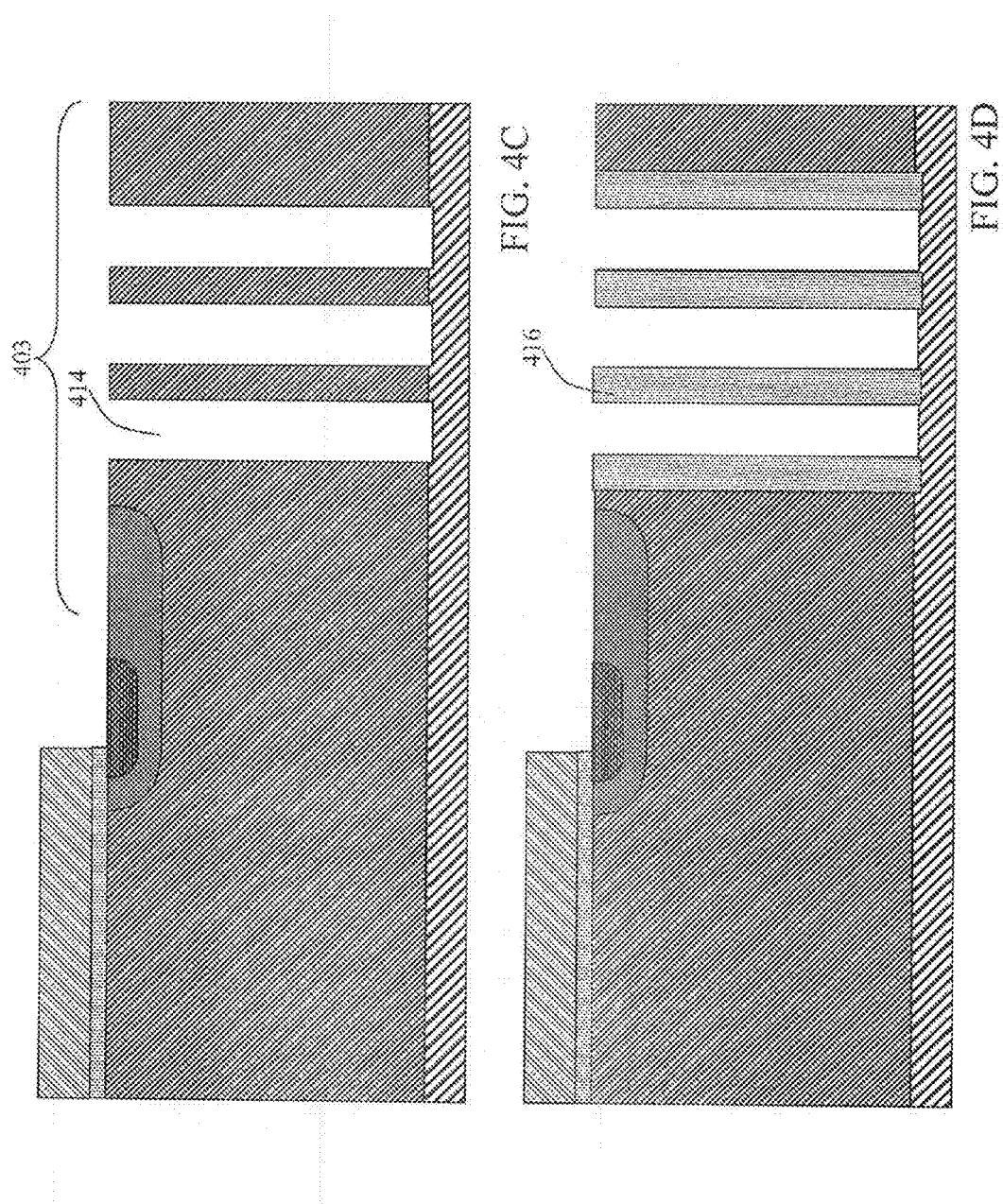

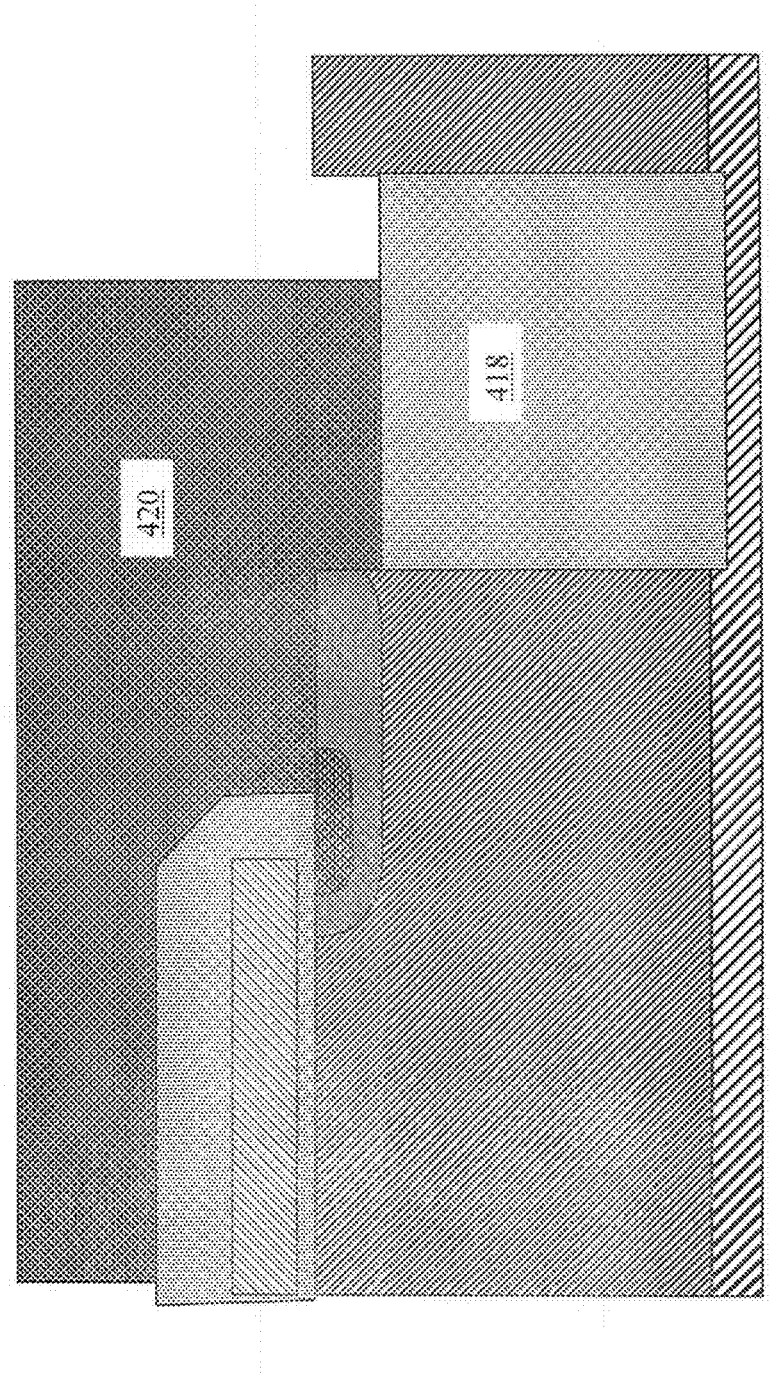

EDGE TERMINATION CONFIGURATIONS FOR HIGH VOLTAGE SEMICONDUCTOR POWER DEVICES

This Patent Application is a Divisional Application and claims the Priority Date of a co-pending application Ser. No. 13/134,163 filed on May 31, 2011 by common Inventors of this Application. The Disclosures made in the patent application Ser. No. 13/134,163 are hereby incorporated by reference.

BACKGROUND OF THE INVENTION

1. Field of the Invention

The invention relates generally to the semiconductor power devices. More particularly, this invention relates to configurations and methods to improve the termination regions of a semiconductor power device for reducing the areas occupied by the termination areas while maintaining high breakdown voltages for the high voltage power devices.

2. Description of the Prior Art

Conventional manufacturing technologies and device configuration to further increase the breakdown voltage of a semiconductor power device at the terminal areas are still confronted with difficulties that the termination areas occupy large areas. The difficulties are becoming more severe and limiting especially when the semiconductor power devices are now manufactured with ever reduced size. A general survey discovers that for smaller chips, the edge termination area takes up about 20% of the total area. However, as size of the chip becomes smaller and smaller, e.g., about 10 times smaller, the percentage of the edge termination area gradually increases and may take up to about 50% of the total area in order to maintain a high breakdown voltage, for example about 600V. The termination area is a "non-active" area of a transistor because the edge terminal is not useful for current conduction. Even though large areas taken up by the edge termination leads to wastes of valuable active cell areas there is still no viable solution to overcome this difficulty.

FIGS. 1A and 1B are cross sectional view of an ideal PN junction with parallel plane breakdown voltage, and an unterminated PN junction at the edge of a vertical power device to explain the need of improvements for edge termination. FIG. 1A shows an ideal PN junction with parallel plane avalanche breakdown. This is the theoretical limit of Breakdown voltage that can be reached for the given doping levels and thickness of the lightly doped N-type drift region. The parallel plane edge termination has P body region 103 and the lightly doped N drift region 107 formed as parallel plane to extend all the way to the edge of the heavily doped N-type substrate 105. The electrical potential lines in this ideal configuration would extend as parallel lines toward the edge and therefore no field crowding effect to adversely affect the breakdown voltage thus achieving a maximum breakdown voltage, e.g., approximately up to 700 volts.

However, the actual breakdown voltage of a reversed bias junction can be severely degraded at the edge, due to field crowding from the formation of a cylindrical junction, as shown in FIG. 1B. It can be observed that the shape of the depletion region is convex, and that leads to the electric field crowding near the junction. The cylindrical breakdown voltage of this edge termination, e.g., approximately 230 volts, is significantly lower than that required for a high voltage, e.g., 600 volts, due to the distribution of the electrical field that are crowded near the edge of the P body region 102.

In order to mitigate this problem, several edge terminations have been proposed, and are widely used in the industry. Some of these include the floating guard rings 90 of FIG. 1C and the Electric Field plate 92 of FIG. 1D. These techniques improve the Breakdown voltage by spreading the depletion region at the surface and thus lowering the electric field. However, these methods typically require large area for implementation, and cause an increase in the die size of the device. In addition, these techniques are prone to surface charges coming from the passivation films and/or the packaging mold compound.

Therefore, an urgent need still exists in the art of power semiconductor device design and manufacture to provide new device configurations and manufacturing method in forming the power devices to reduce the areas taken up by the edge termination while maintaining sufficiently high breakdown voltage such that the above discussed problems and limitations can be resolved.

SUMMARY OF THE PRESENT INVENTION

It is therefore an aspect of the present invention to provide a new and improved edge termination configuration to reduce the electrical field crowding effects in the termination area such that the required area in the edge termination can be reduced while achieving high breakdown voltage thus resolving the problems and difficulties as that encountered in the conventional technologies.

Specifically, an aspect of this invention is to provide a new and improved edge termination configuration that can effectively move the peak electrical field point into a region laterally away from a P body region thus making the potential lines flatter in the silicon thus reducing the electric field crowding and significantly increases the breakdown voltage without requiring large termination area.

It is another aspect of this invention to provide the new and improved edge termination configuration by forming a wide oxide trench with a buried field plate extends laterally along a top part of the oxide trench, proximity to the P body region, such that the peak electrical field is laterally moved away from the body region thus reduces the field crowding effect and increasing the breakdown voltage while reducing the required area of the edge termination.

Briefly in a preferred embodiment this invention discloses a semiconductor power device disposed in a semiconductor substrate and having an active cell area and an edge termination area wherein the edge termination area comprises a wide trench filled with a field-crowding reduction filler and a buried field plate buried under a top surface of the semiconductor substrate and laterally extended over a top portion of the filled trench to move a peak electric field point laterally away from the active cell area. In a specific embodiment, the field-crowding reduction filler comprises a silicon oxide filled in the wide trench.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 2C is a cross sectional view of the edge termination technique using a wide and deep oxide trench and a field plate for improving the breakdown voltage.

FIGS. 3A-3C are cross sectional views to illustrate the alternative improved edge termination configurations with a wide and deep oxide trench along with a buried field plate that is effective to move the peak electrical field into the oxide trench to make the potential lines flatter in the termination area thus significantly improving the breakdown voltage.

FIGS. 4A-4G are cross-sectional views to illustrate a method for making the edge termination of the type depicted in FIGS. 3A-3C.

DETAILED DESCRIPTION OF THE METHOD

Introduction

Figure 1B:
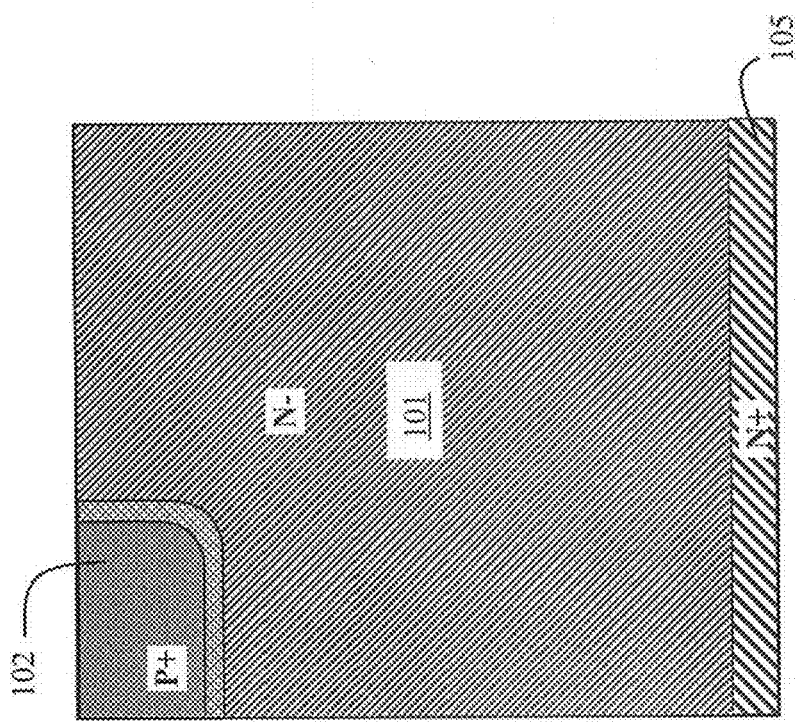
FIG. 1B is a cross sectional view for an un-terminated P-N junction at the device edge that forms a cylindrical junction at the device edge that causes electric field crowding and severe reduction of termination breakdown voltage.
Figure 1A:
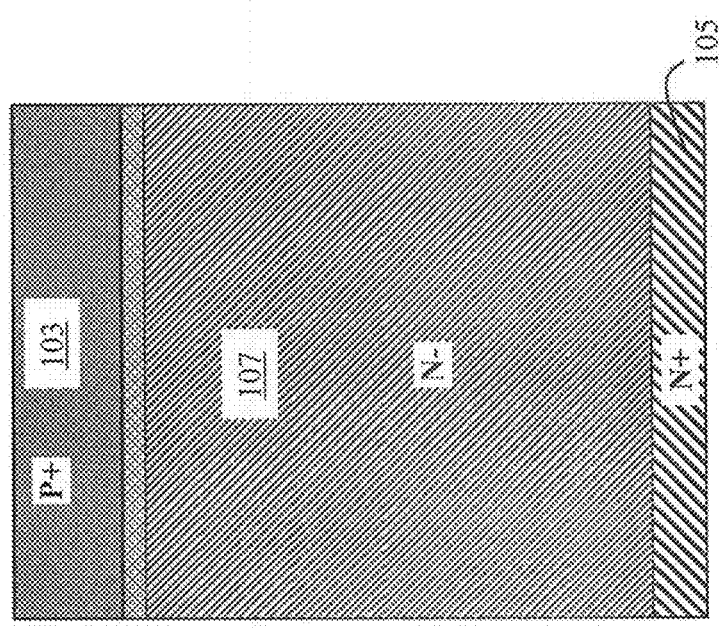
FIG. 1A is a cross sectional view showing an ideal parallel plane junction configuration that achieves the maximum breakdown voltage.
Figure 1C:
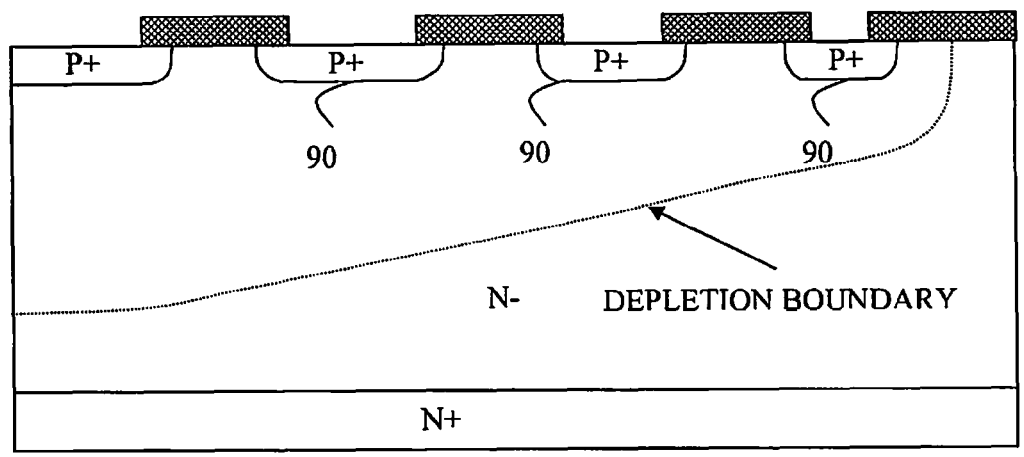
FIG. 1C is a cross sectional view of the edge termination technique using floating field rings, which consists of several islands of P type regions at the device surface.
Figure 1D:
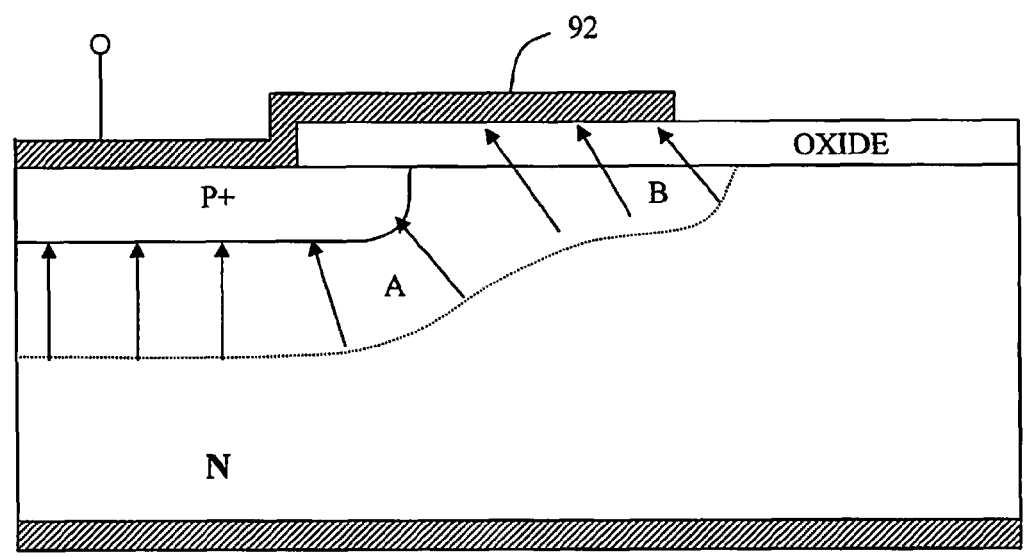
FIG. 1D is a cross sectional view of the edge termination technique using electric field plate, which consists of one or more electrodes tied to source/guard rings for spreading the electric field.
Figures 2A, 2B:
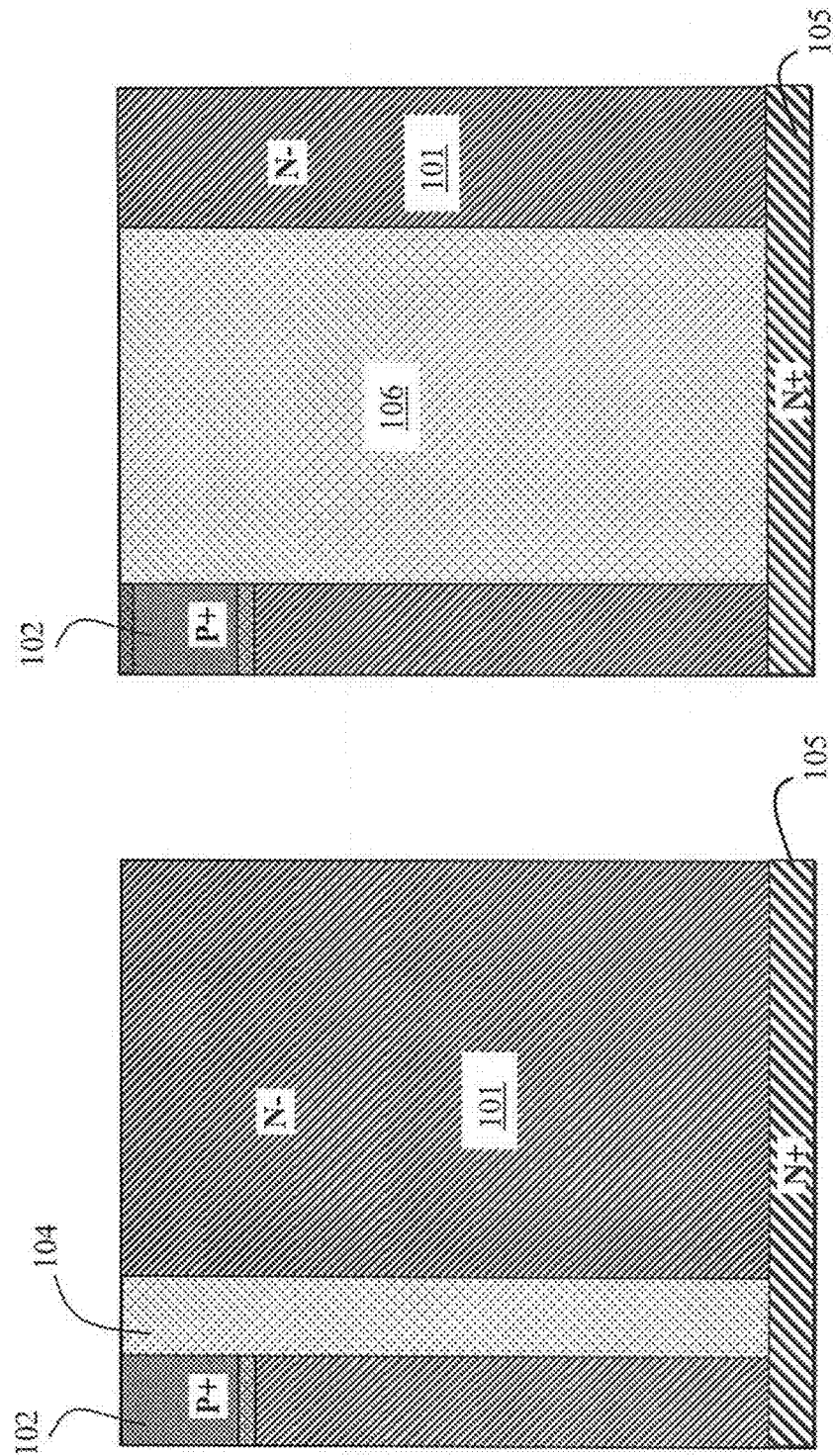
FIG. 2A is a cross sectional view of the edge termination technique using a narrow and deep oxide trench for improving the breakdown voltage.
FIG. 2B is a cross sectional view of the edge termination technique using a wide and deep oxide trench for improving the breakdown voltage.

In order to overcome this electrical field crowding phenomena, a deep and narrow oxide trench 104 as that shown in FIG. 2A is attempted. In this approach, a deep oxide trench 104 is formed in the lightly doped N-type drain drift layer 101 adjacent to the P body region 102 with a width of the trench 104 is about five microns. Even that the deep oxide trench of five microns width is theoretically sufficient to block a voltage of 700 volts, the deep oxide trench 104 as shown in FIG. 2A, however, is not effective to increase the breakdown voltage beyond a range of 250 volts to 300 volts. The reason that the deep oxide trench 104 is not effective is due to the fact that the width of the oxide trench is not wide enough to flatter the electrical potential lines, which causes the potential lines bending ninety degrees from the silicon to the oxide trench with the peak electric filed point at the silicon region, not in the oxide region. The bending of the electrical potential lines causes the field crowding at the edge of the silicon near the cylindrical junction, thus causing a lower breakdown voltage.

Figures 2C, 3A:
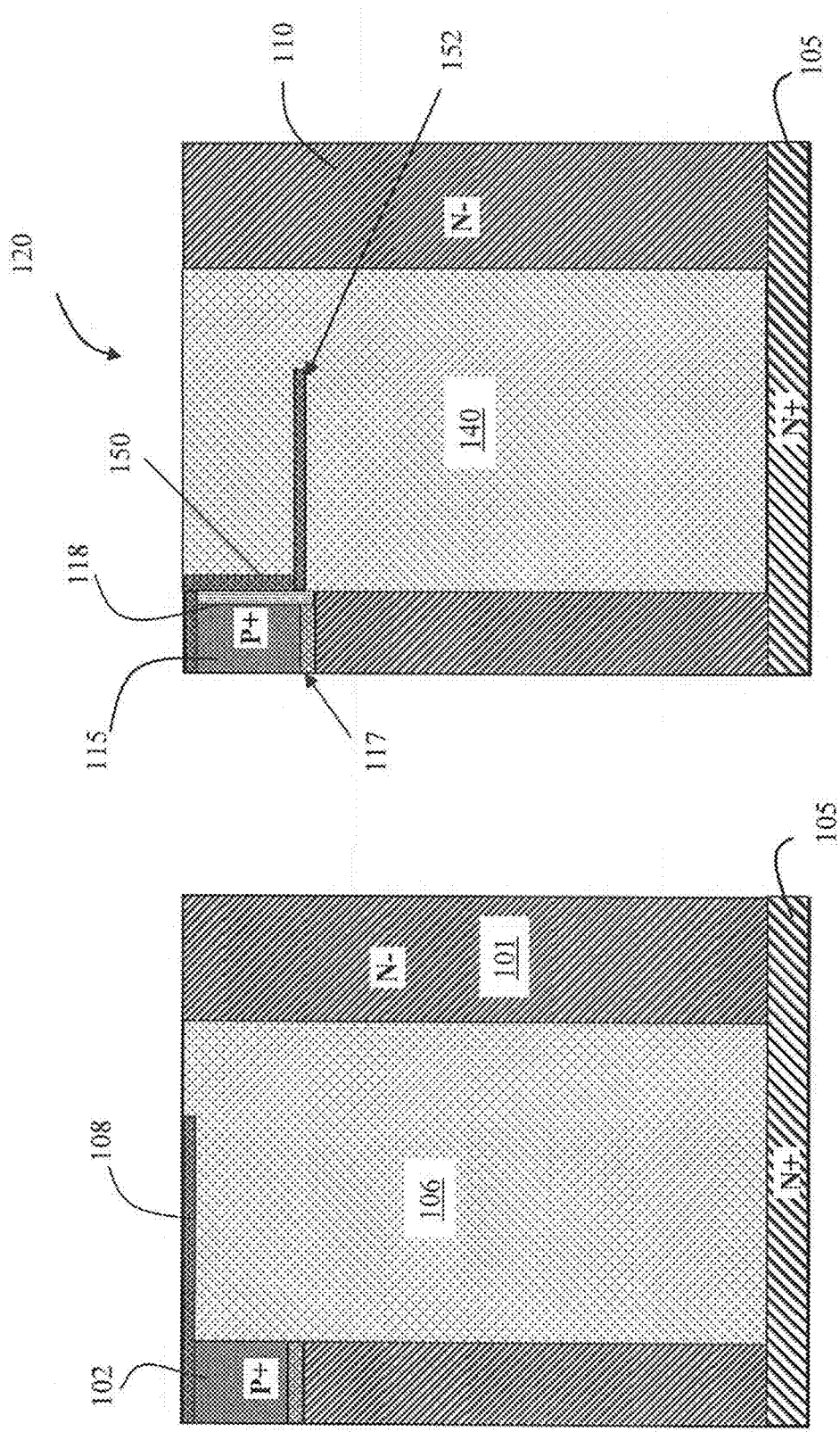

FIGS. 2B and 2C are two other edge termination configurations in attempt to increase the breakdown voltage. In FIG. 2B, the width of the deep oxide trench 106 is about 25 microns and a breakdown voltage of about 500V is achieved. In addition to FIG. 2B, as shown in FIG. 2C, a field plate 108 of about 20 microns width is placed on the top surface of the semiconductor substrate, within the oxide trench, adjacent to the P body region 102, which achieves higher breakdown voltage of about 586V. The wide oxide trench and the field plate are implemented in order to move the peak electrical field point into the oxide to reduce the field crowding. With the wide oxide trench and the field plate, the electrical potential lines are spread further along a lateral direction and the electrical potential lines are flatter in the silicon thus reducing the field crowding effect. However, the breakdown voltage, even with significant improvements as shown in FIGS. 2B and 2C are not sufficient to allow sufficient design margin such that the areas taken up by the termination areas can be reduced for the purpose of assure sufficient breakdown voltage, e.g., a breakdown exceeding 600 volts, are provided for the high voltage devices.

Embodiment of the Present Invention

FIG. 3A is a cross sectional view for illustrating an embodiment of this invention that improves the breakdown voltage while reduce the required termination area. The device is supported on a lightly doped N-type epitaxial layer 110 supported on a heavily doped N-type semiconductor substrate 105 with a P body region 115 formed at the inner edge of a termination area 120 next to an outer edge of an active cell area (not shown). For the purpose of increasing the breakdown voltage a broad oxide trench 140, with a width between 20 to 30 microns, is formed next to the P body region 115.

Additionally, a buried field plate 150 is formed in near the top surface of the oxide trench 140 and adjacent to the P body region 115 having a depth buried in the substrate proximity to the bottom of the body region 115 in the epitaxial layer 110. The buried field plate 150 with a buried lateral extension 152 reduces the surface charge and therefore is effective to move the peak electrical field into the oxide and make the potential lines flatter in the silicon. The breakdown voltage is therefore significantly improved, e.g., approximately 625 volts, and is able to satisfy the breakdown voltage requirements for the high voltage device while the required width of the edge termination is significantly reduced, e.g., between 40 to 60 microns. Therefore, the improved edge termination as shown in FIG. 3A requires a width of about one-fourth to one-tenth of the conventional width, which is about 200 microns, to provide sufficiently high breakdown voltage compared with the width that is generally required in a conventional device. However, for this edge termination configuration, the bottom portion 150 of the field plate 152 is positioned about the same depth of the depletion region 117, which causes a high current leakage. The high current leakage can be reduced by forming a thin oxide layer 118 between the field plate 150 and the P body region 115.

In addition, the high current leakage of the edge termination configuration shown in FIG. 3A can be avoided by positioning the bottom portion 152 of the field plate 150 either above or below the depletion region 117. FIG. 3B shows an edge termination configuration with the bottom portion 152 of the field plate 150 positioned above the depletion region 117. FIG. 3C shows an edge termination configuration with the bottom portion 152 of the field plate 150 positioned below the depletion region 117. Furthermore, in this edge termination configuration, a Schottky contact 119 is formed between the field plate 150 and the N-type epitaxial layer 110. One advantage of this edge termination configuration is the flexibility in manufacturing process, in which the trench can be formed deeper than the body region 115 without affecting the BV/leakage, which is described in FIGS. 4A-4G.

As shown in FIG. 4A, a heavily doped N type substrate 402 with a lightly doped N-type epitaxial layer 404 grown on top of the substrate 402 is provided, which includes an active region 401 and a termination region 403. A power device, for example a metal-oxide-semiconductor field effect transistor (MOSFET), is formed on an active region 401 of the substrate. The MOSFET includes a P-body region 410 formed by implantation of the P-type dopants on a top portion of the N-epitaxial layer 404, a N+ source region 412 formed by the implantation of the N-type dopants on a top portion of the P-body region 410 and a gate region 406 electrical isolated from the N-type epitaxial layer 404, the source 412 and the P-body region 410 by a thin dielectric layer 408.

Figure 4E:
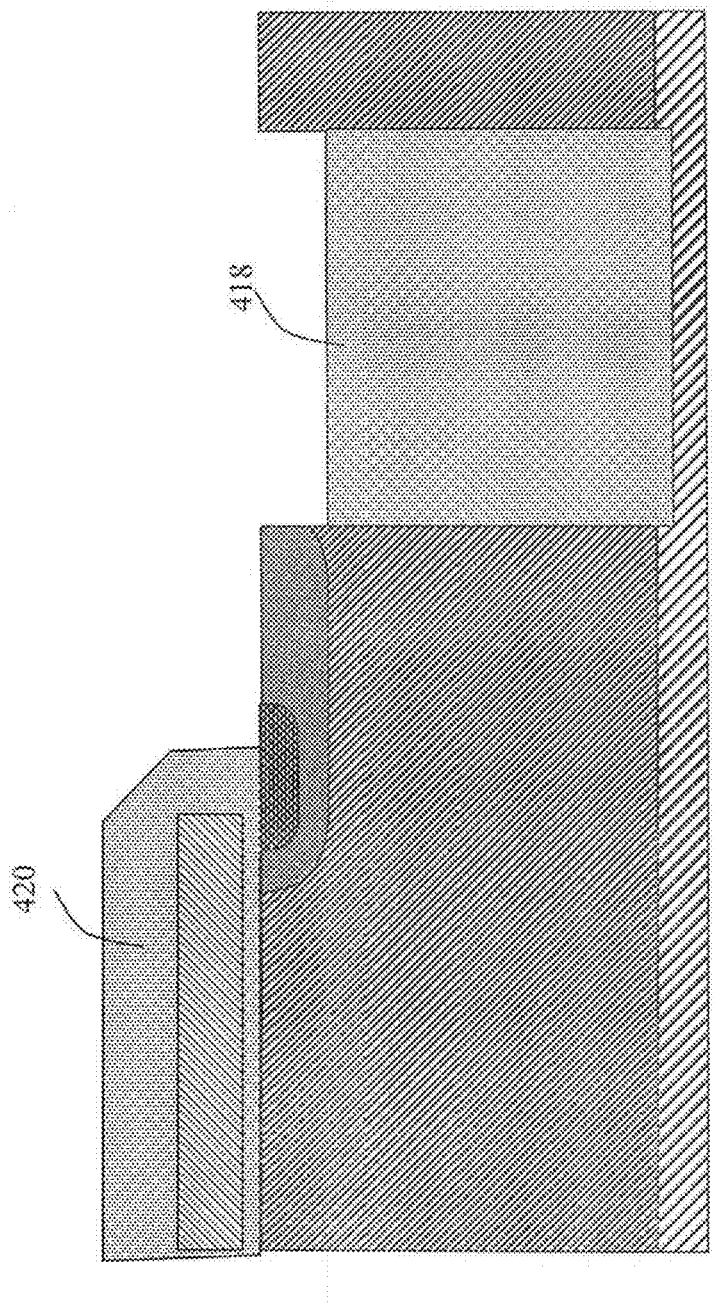

As shown in FIG. 4C, a plurality of narrow trenches 414 are formed on the termination region 403 by etching the N-epitaxial layer 404 with an end point stopping at the top surface of the substrate 402 followed by the oxidation of the silicon mesa 416 between the trenches 414 and the sidewall portions of the N-epitaxial layer 404 adjacent to the trenches 414. A dielectric material, such as an oxide, is filled in to the trenches 414 and on top of the structure then is etched back to form an dielectric layer 418 inside the N-epitaxial layer 404 in the termination region and a dielectric layer 420 cover the gate 406 in the active region. As shown in FIG. 4E, the top surface of the dielectric layer 418 is about the same level with the bottom surface of the P-body region 410 generating the current leakage after the field plate formed in the next step, which can be avoid by forming a thin dielectric layer between the P-body region and the field plate (not shown). Preferably, the top surface of the dielectric layer 418 is either below or above the bottom surface of the P-body region 410 to avoid a current leakage after the field plate formed in the next step.

Figure 4G:
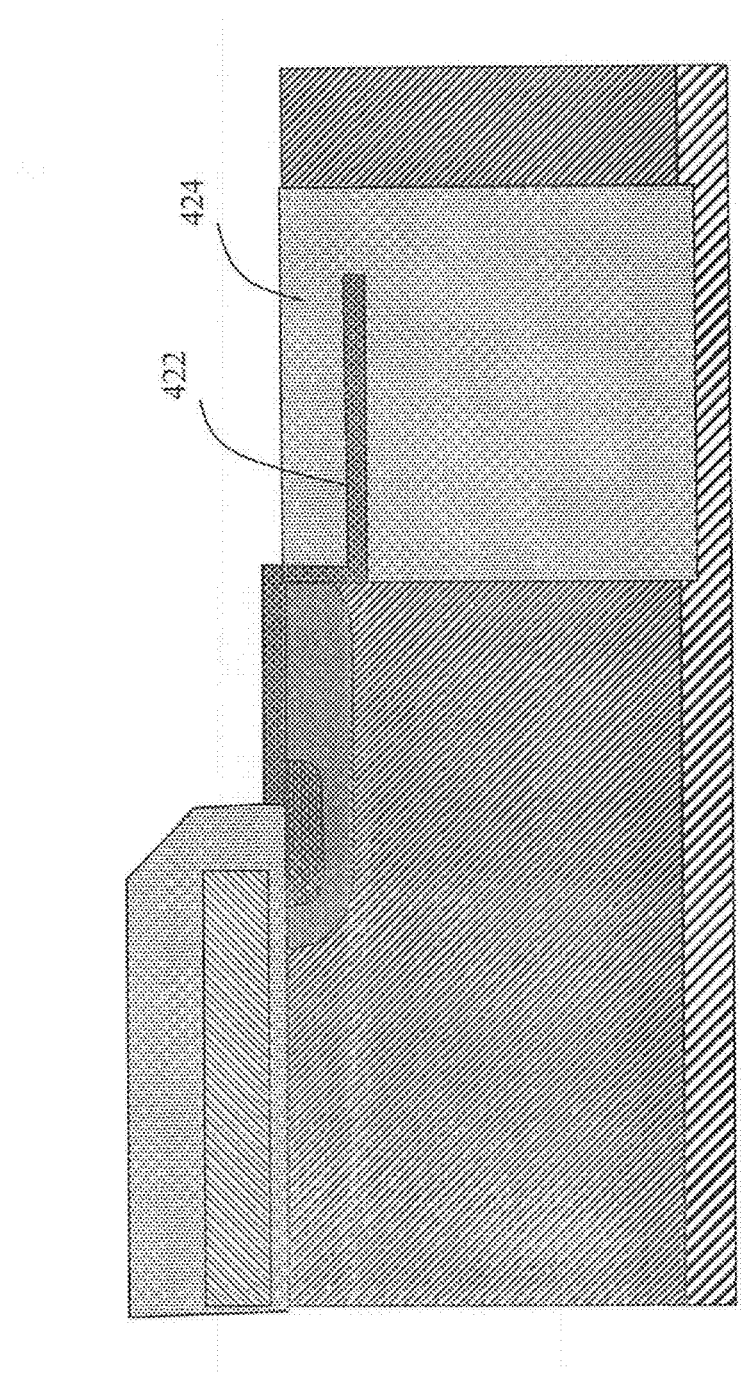

As shown in FIG. 4F, a metal mask is applied on top of the structure (not shown) and a metal 420 is deposited and etched back to form a field plate 422 as shown in FIGS. 4F-4G. A dielectric material 424 is filled on top of the field plate 422 as shown in FIG. 4G to complete the device.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method to manufacture a semiconductor power device in a semiconductor substrate with an active cell area and an edge termination area comprising:
    open a wide trench in the edge termination area immediately adjacent to a body region disposed on an outer edge of the active cell area and filling the wide trench with a field-crowding reduction filler followed by etching the field-crowding reduction filler down to a level below a top surface of said wide trench; and
    forming a buried field plate along a sidewall of said wide trench and extending vertically along the body region on the outer edge of the active area and cover a top surface of said field-crowing reduction filler followed by filling the wide trench with the field-crowding reduction filler thus burying the buried field plate in the wide trench below the top surface of the trench.

2. The method of claim 1 wherein:
the step of filling the wide trench with the field-crowding reduction filler comprises a step of filling the wide trench with silicon oxide.

3. The method of claim 1 wherein:
the step of opening the wide trench in the edge termination area further comprising a step of opening the wide trench with a width ranging from 5 microns to 50 microns in the edge termination area having a width ranging from 10 microns to 60 microns.

4. The method of claim 1 wherein:
the step of etching the field-crowding reduction filler down to a level below a top surface of said wide trench further comprising a step of etching the field-crowding reduction filler down to a depth ranging from 1.5 microns to 5 microns below the top surface of the wide trench.

5. The method of claim 1 wherein:
the step of opening the wide trench in the edge termination area further comprising a step of opening a plurality of narrow trenches in the edge termination area followed by oxidizing the semiconductor substrate between the narrow trenches to function as the field-crowding reduction filler then filling the narrow trenches by depositing the field-crowding reduction filler.

6. The method of claim 1 wherein:
the step of forming the buried field plate is a step of forming the buried under the top surface of the semiconductor substrate and above a depletion region at a bottom surface of the body region; and
the step of etching the field-crowding reduction filler down to a level below a top surface of said wide trench further comprising a step of etching the field-crowding reduction filler down to a depth above a depletion region at a bottom surface of the body region.

7. The method of claim 1 wherein:
the buried field plate is buried under the top surface of the semiconductor substrate and above a depletion region at a bottom surface of the body region; and
the step of etching the field-crowding reduction filler down to a level below a top surface of said wide trench further comprising a step of etching the field-crowding reduction filler down to a depth below a depletion region at a bottom surface of the body region.

8. The method of claim 1 wherein:
the step of forming the buried field plate further comprises a step of forming the buried field plate with a top portion covering a part of a top surface of the body region and a vertical portion extends vertically downward along the sidewall of the wide trench to connected to the buried field plate buried in the wide trench.

* * * * *